(12) United States Patent
Nelles et al.

(10) Patent No.: US 9,177,997 B2
(45) Date of Patent: Nov. 3, 2015

(54) MEMORY DEVICE

(71) Applicant: SONY CORPORATION, Minato-ku (JP)

(72) Inventors: Gabriele Nelles, Stuttgart (DE); Silvia Rosselli, Stuttgart (DE); Mustafa Sarpasan, Stuttgart (DE); Nikolaus Knorr, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/365,309

(22) PCT Filed: Nov. 8, 2012

(86) PCT No.: PCT/IB2012/002824
§ 371 (c)(1),
(2) Date: Jun. 13, 2014

(87) PCT Pub. No.: WO2013/088240
PCT Pub. Date: Jun. 20, 2013

(65) Prior Publication Data
US 2014/0346430 A1 Nov. 27, 2014

(30) Foreign Application Priority Data
Dec. 13, 2011 (EP) .................................... 11193252

(51) Int. Cl.
*H01L 27/24* (2006.01)
*G11C 13/00* (2006.01)
*H01L 45/00* (2006.01)

(52) U.S. Cl.
CPC .......... *H01L 27/2418* (2013.01); *G11C 13/003* (2013.01); *G11C 13/0007* (2013.01); *G11C 13/0014* (2013.01); *H01L 45/1226* (2013.01); *H01L 45/16* (2013.01); *G11C 2013/0073* (2013.01); *G11C 2213/52* (2013.01); *G11C 2213/73* (2013.01)

(58) Field of Classification Search
USPC ............................................................ 257/4
See application file for complete search history.

(56) References Cited

U.S. PATENT DOCUMENTS

| | | | |
|---|---|---|---|
| 7,399,691 B2 | 7/2008 | Lieber et al. | |
| 2009/0303784 A1* | 12/2009 | Lowrey | ......................... 365/163 |

(Continued)

FOREIGN PATENT DOCUMENTS

| | | |
|---|---|---|
| JP | 2006-32867 A | 2/2006 |
| WO | WO 2006/045764 A1 | 5/2006 |
| WO | WO 2010/136007 A2 | 12/2010 |

OTHER PUBLICATIONS

International Search Report and Written Opinion issued Feb. 18, 2013 in PCT/IB2012/002824.

(Continued)

*Primary Examiner* — Thao P Le
(74) *Attorney, Agent, or Firm* — Oblon, McClelland, Maier & Neustadt, L.L.P.

(57) ABSTRACT

Microelectronic device, comprising a substrate, a first electrode arranged above the substrate, a first resistive switch and a resistivity structure coupled with each other, wherein the first resistive switch and the resistivity structure are arranged in a single layer of the device, and a second electrode arranged above the layer that includes the first resistive switch and the resistivity structure, wherein the first resistive switch and the resistivity structure are coupled with the first and the second electrode.

13 Claims, 10 Drawing Sheets

(56) References Cited

U.S. PATENT DOCUMENTS

| | | | |
|---|---|---|---|
| 2010/0102290 A1 | 4/2010 | Lu et al. | |
| 2012/0087173 A1 | 4/2012 | Linn et al. | |
| 2014/0029327 A1* | 1/2014 | Strachan et al. | 365/148 |
| 2014/0247527 A1* | 9/2014 | Otake et al. | 361/56 |
| 2015/0011071 A1* | 1/2015 | Wang et al. | 438/382 |

OTHER PUBLICATIONS

S. Tappertzhofen, et al., "Capacity based nondestructive readout for complementary resistive switches" Nanotechnology, IOP, vol. 22, No. 39, XP 020210677, Sep. 5, 2011, pp. 1-7.

C. Nauenheim, et al., "Nano-Crossbar Arrays for Nonvolatile Resistive RAM (RRAM) Applications" Nanotechnology, IEEE, XP 031315526, Aug. 18, 2008, pp. 464-467.

Qi-Dan Ling, et al. "Polymer electronic memories: Materials, devices and mechanisms" Progress in Polymer Science, vol. 33, No. 10, XP 025654703, Oct. 1, 2008, pp. 917-978.

J. Campbell Scott, et al., "Nonvolatile Memory Elements Based on Organic Materials" Advanced Materials, vol. 19, 2007, pp. 1452-1463.

Eike Linn, et al., "Complementary resistive switches for passive nanocrossbar memories" Nature Materials, vol. 9, May 2010, pp. 403-406.

Rainer Waser, et al., "Nanoionics-based resistive switching memories" Nature Materials, vol. 6, Nov. 2007, pp. 833-840.

Larry Senesac, et al., "Nanosensors for trace explosive detection" Materials Today, vol. 11, No. 3, Mar. 2008, pp. 28-36.

Rainer Waser, et al., "Redox-Based Resistive Switching Memories—Nanoionic Mechanisms, Prospects, and Challenges" Advanced Materials, vol. 21, 2009. pp. 2632-2663.

D. Prime, et al., "Overview of organic memory devices" Philosophical Transactions of the Royal Society, vol. 367, Sep. 21, 2009, pp. 4141-4157 and cover page.

Harika Manem, et al., "A Crosstalk Minimization technique for Sublithographic Programmable Logic Arrays" IEEE NANO, 2009, pp. 218-221.

Sung Hyun Jo, et al., "High-Density Crossbar Arrays Based on a Si Memristive System" NANO Letters, vol. XX, No. X, Dec. 13, 2008, 6 pages.

* cited by examiner

MEMORY DEVICE

CROSS REFERENCE TO RELATED APPLICATIONS

The present application is a 35 U.S.C. §371 national stage patent application of International patent application PCT/IB2012/002824, filed on Nov. 8, 2012, published as WO/2013/088240 on Jun. 20, 2013, the text of which is incorporated by reference, and claims the benefit of the filing date of European application no. 11 193 252.1, filed on Dec. 13, 2011, the text of which is also incorporated by reference.

BACKGROUND

The disclosure refers to a passive cross bar memory device and a corresponding method of manufacture.

Passive cross bar memory devices include an array of parallels strips of top and bottom electrodes crossing each other and having a layer of a bistable resistive switching material sandwiched between them. The resistive switching material comprises two stable states which differ in the resistance of the layer: A low resistive ("ON") state and a high resistive ("OFF") state. By applying a positive or a negative voltage pulse, it is possible to switch between these states. The state of the switch is stored non-volatile, i.e. it is thus sustained even if no voltage is applied to the switch. Accordingly, by applying a voltage of a correct intensity and polarity between one of the strips of the top electrodes and one of the strips of the bottom electrodes the bistable resistive switching material in the region sandwiched between the top and bottom electrodes where a memory cross point is formed can be switched from a state of high conductivity to a state of low conductivity defining, for example, the binary states "0" and "1". Reversing the voltage with a sufficient intensity will cause a switching of the bistable switching material back to a state of a high conductivity.

SUMMARY

Passive cross bar memory devices have the advantages over active memory architectures of a simpler design, easier fabrication and small cell unit size.

Currently, a major effort is made to develop new nonvolatile memories made of passive cross bar arrays that are made with inorganic or organic thin films with bistable switching characteristics. Many inorganic and organic materials have been found to be suitable as resistive switching materials. They can be classified according to different groups of physical processes that are responsible for their bistable switching properties. For some of the materials the resistive switching property is due to an internal physical process in the material itself, while for other materials the resistive switching property is due to an interaction of the inorganic or organic material with the electrodes. For some of those materials, the electrodes can be made out of the same material, while for others, the electrodes must be made of different materials in order to observe the bistable switching properties.

A major challenge to realize larger memories with an increased number and density of storage cross points consists in solving the problem of sneak currents through undesired paths of low resistance such as neighboring cross points in the cross bar array. With an increasing number of memory cross points and a decreasing distance between the cross points in the array also the level of sneak currents through undesired paths increases and becomes too significant.

FIG. 1 shows a simplified example of a section of a memory device comprising a 2×2 array of memory cross points. The 2×2 array of cross points is formed by two parallel strip top electrodes crossing two parallel strip bottom electrodes sandwiching a bistable resistive memory material between them. FIG. 2 shows the memory device in a perspective view, wherein only sections of the bistable memory material corresponding to the area of the crossing top and bottom electrodes where the memory is formed are shown. If memory cross points A, B and C are in a state of high conductance, as indicated by "1" in FIG. 2, the unambiguous, addressing of memory cross point D is difficult, since the application of a voltage between a top strip electrode and bottom strip electrode crossing each other at memory cross point D induces sneak currents through neighboring memory cross points that are in state of high conductivity. For example, when addressing memory cross point D a sneak current may flow through memory cross points C, B, and A.

In order to suppress sneak currents it has been proposed to connect a current rectifying diode to each memory cross point in order to suppress sneak currents [1].

Furthermore, it has been proposed to suppress sneak currents by stacking two layers of resistive switching materials with complementary resistive switching characteristics on top of each other and providing electrodes between and on top of the layers [2].

However, the stacking of several layers of resistive switching materials with complementary switching characteristics and small pads of floating electrodes considerably increases the complexity of the memory device and may not be suitable for all material combinations. In particular, undesirable asymmetries between the stacked layers of resistive switching materials may arise due to variations of their thicknesses during the fabrication process.

Furthermore, conventional semiconductor processing techniques are frequently not suitable for a use with inorganic or organic resistive switching materials which can be delicate and easily damaged by conventional etching processes and solvents used for photoresist mask patterning. In order to avoid these detrimental processes and solvents more complex replacement techniques must be used for the deposition of layers of organic resistive switching material and of subsequent layers which makes a deposition of several layers of organic resistive switching materials less desirable.

It is the object of the present disclosure to provide a memory device comprising a resistive switching material that can be operated with reduced sneak currents flowing through neigh-boring memory cross points and that can be fabricated without a significant increase of device complexity, and a corresponding method of fabrication.

This object is achieved with a memory device having the features of claim 1 and a method having the features of claim 9.

According to the disclosure a microelectronic device is provided that comprises a substrate, a first electrode arranged above the substrate, a first resistive switch and a resistivity structure coupled with each other, wherein the first resistive switch and the resistivity structure are arranged in a single layer of the device, and a second electrode arranged above the layer that includes the first resistive switch and the resistivity structure, wherein the first resistive switch and the resistivity structure are electrically coupled with the first and the second electrode.

The microelectronic device permits to reduce sneak currents through undesired paths of low resistance due to the resistivity structure that comprises a current resistivity that is high enough to suppress or sufficiently reduce sneak currents through the resistive switch included in a memory crosspoint, even if the resistive switch is in a state of high conductivity.

Due to the forming of the first resistive switch and of the resistivity structure in the same layer and horizontally side by side, an excessive increase of complexity of fabrication of the device can be avoided. In particular, the device does not comprise several layers of resistive switching materials stacked over each other which avoids asymmetries between the layers due to thickness variations during the fabrication process.

Furthermore, the inclusion of a means for suppressing sneak currents essentially concerns the modification of the layer of the device that includes the resistive switching material only, while the remaining layers and their fabrication steps remain unchanged.

According to one embodiment, the resistivity structure is a second resistive switch that is anti-serially coupled with the first resistive switch, wherein both of the first resistive switch and the second resistive switch are formed in the same layer of the microelectronic device.

According to another embodiment the first resistive and the second resistive switch are configured to change their state of conductivity between a state of high conductivity and a state of low conductivity upon application of an electric field or an electric current across the bistable switching material of the first resistive switch and the second resistive switch. A change of the state of conductivity back to the previous state can be obtained with an electric field or electric current of opposite polarity and similar or equal strength.

In this embodiment, a switching between the states to store information in a memory crosspoint can be effected as follows. In order to write information such as a binary "1" to the memory device, a negative voltage below a threshold voltage is applied between the first electrode and the second electrode that transfers the first resistive switch to a state of low conductivity or high resistivity, while the second resistive switch that is anti-serially coupled with the first resistive switch remains in a state of high conductivity or a low resistivity, since the applied negative voltage does not cause a transfer of its state. A voltage that is, for example, applied between the first electrode and the second electrode during a readout operation of the memory crosspoint transfers the first resistive switch that is in a state of low conductivity into a state of high conductivity. Then a measurable current pulse can be detected that identifies the storage state as a binary "1". However, due to the reading the stored information is destroyed and has to be rewritten by applying a negative voltage to transfer the first resistive switch back into a state of low conductivity.

For switching the memory device into a state of a binary "0", a positive voltage of a sufficient strength beyond a threshold voltage is applied between the first electrode and the second electrode. This transfers the second resistive switch into a state of low conductivity and high resistivity, while the first resistive switch is switched into a state of high conductivity and low resistivity. Applying a read pulse does not affect the storage state of both switches, since no current is detected. Hence the storage information does not have to be rewritten.

In both memory states of the memory device, i.e. in the binary memory state "0" and in the binary memory state "1", one of the resistive switches of the complementary resistive switch remains in a state of high resistivity that prevents or reduces sneak currents through the memory cross point. It is clear that the definition of the binary state "0" and of the binary state "1" associated with a state of high conductivity and a state of low conductivity of the resistive switch, respectively, is arbitrary and could be reversed.

The first resistive switch and the second resistive switch may each comprise two electrodes of different materials that can have different work functions. Preferably, the first resistive switch and the second resistive switch comprise the same structure and also the same resistive switching material, but are anti-serially coupled. Furthermore, the first resistive switch and the second resistive switch can comprise one common electrode.

According to an embodiment, the first resistive switch and the second resistive switch are formed with a single piece of bistable resistive switching material. This can be achieved by forming two resistive switches on a single piece of bistable resistive switching material with electrodes at the bottom and on the top thereof.

An anti-serial connection of the two resistive switches is achieved by connecting either the two top electrodes or the two bottom electrodes on one side of the resistive switching material with each other or by providing a single electrode extending over the piece of resistive switching material, and by connecting the separate electrodes on the opposite side of the resistive switching material corresponding to the two resistive switches with the first and second electrode, respectively.

According to another embodiment, the resistivity structure is a diode such as a Schottky diode including a metal-semiconductor junction. Similar to a complementary resistive switch including a first resistive switch in combination with a second resistive switch, the diode can ensure due to its rectification properties a low conductance and high resistivity of the memory crosspoint independent of whether the resistive switch is in the state of high or low resistivity. The metal-semiconductor transition can also include a semiconductor material that has bistable resistive switching properties so that it can be used directly as the resistive switching material, and a metal in contact with the resistive switching material that forms the electrode or a part thereof. By using a semiconductor material that comprises resistive switching properties a resistive switch can be formed that in addition comprises rectifying properties that reduce or avoid sneak currents. Examples of semiconductor materials having properties as bistable resistive switching materials are indicated below. Alternatively, the semiconductor material can be provided separate from the resistive switching material and electrically connected therewith.

According to another embodiment the electrodes provided on the resistive switching material are formed by metals. The electrodes provided on the two sides of a resistive switch material can be made of different metals with different work functions. A number of organic and inorganic materials show resistive switching properties in combination with electrodes being made of different materials or metals, while other materials show resistive switching properties in combination with electrodes that are made of the same material or metal.

For unipolar (or nonpolar) materials, the switching direction depends on the amplitude of the applied voltage but not on the polarity. For bipolar materials, also referred to as reverse polarity switching, the ON and OFF switching is achieved at different polarities.

Details with respect to inorganic resistance switching random access memory (RRAM) materials can be found in the review articles [3], [4], and [5]. Typically, M/I/M structures are used, where the 'I' can be one of a wide range of binary (e.g., $SiO_2$, NiO $Al_2O_3$, or $TiO_2$) and multinary oxides (e.g., La$_2$CuO$_4$), perovskites (e.g., Nb or Cr:SrTiO$_3$ or (Pr,Ca)MnO$_3$), solid-state electrolytes (e.g., GeS, GeSe, or Cu$_2$S), or phase change chalcogenides (e.g., Ge$_2$Sb$_2$Te$_5$ or AgInSbTe), and the 'M' stands for a similarly large variety of metal electrodes including electron-conducting non-metals.

Details with respect to organic materials that can be used as a resistively switching material (RRAM) are summarized in the review articles [6], and [7]. The operating mechanisms of the switching behavior are not yet completely understood and still debated in the literature.

As electrode materials, often Al, ITO, Au, Cu, Ag, doped Si, carbon based materials (pyrolyzed resists, graphite, HOPG), or conducting polymers are used. The organic materials sandwiched in between the top and the bottom electrodes, may be, e.g., conjugated polymers, small molecules, donor-acceptor complexes, mobile-ion materials, or nano-cluster or nanoparticle blends. Some of the better studied systems are Cu/Cu:TCNQ/Al, Cu/Poly(3-hexylthiophene)/Al, and pyrolyzed-photoresist-film/Polypyrrole/TiO$_2$/Au.

Yet other materials showing resistive switching properties can be used in combination with electrodes that are made of organic conductors. Those conductors can comprise polyacenes.

According to yet another embodiment the resistive switch material in the first resistive switch and the second resistive switch is an organic bistable polymer.

In the following examples of different materials that are suitable as resistive switching materials are listed. The materials are described in the European patent application EP 08014162.5 that is hereby incorporated by reference.

For example, a resistive switch may be formed by metal-insulator-metal (MIM) materials exhibiting resistive switching characteristics including simple oxides such as TiO$_2$, Al$_2$O$_3$, Ni$_2$O$_3$. Suitable contacts are formed by metals with a high ion mobility like Cu, Au, Ag etc.

A resistive switch may also be formed by a "metal-polymer-metal" material system, wherein the polymer comprises semiconductive characteristics. This material system shows the so called "filament switch effect". Suitable polymers include for example poly(3-hexylthiophene) (P3HT), polyaniline, poly(phenylene vinylene)-disperse red 1 (PPV-DR1), polysiloxane carbazole (PSX-Cz), polypyrrole, poly(o-anthranilic acid) (PARA) and poly(aniline-co-o-anthranilic acid) (PANI-PARA). The polymer is contacted by at least one metal having a high ion mobility like Cu, Au, Ag etc.

The structural formulas of the above mentioned polymers are shown below:

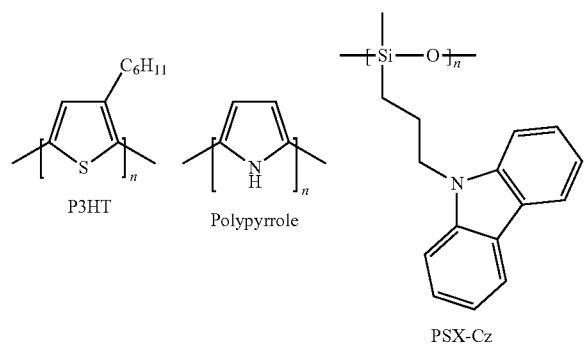

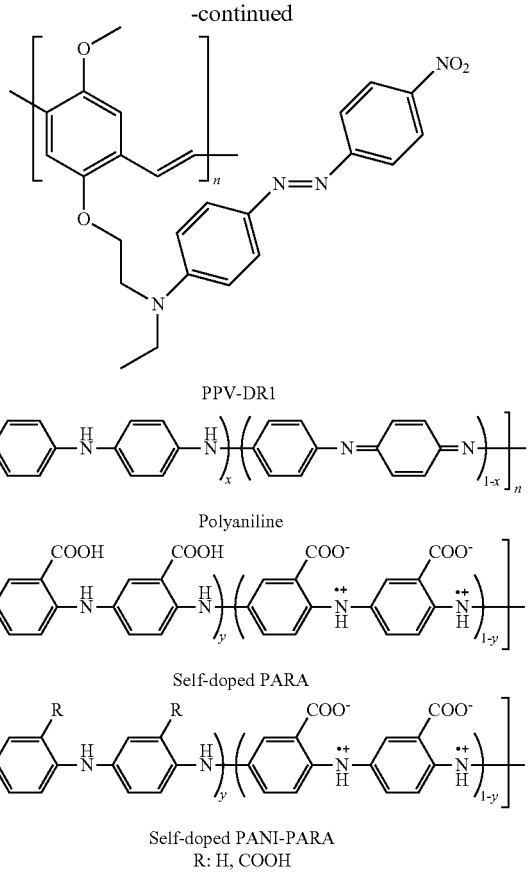

Suitable resistive switching materials also include or consist of materials that exhibit a change of conductivity upon application of an electrical field. Resistive switching materials of this category can be materials that include components that undergo a charge transfer in response to an application of an electric field. This category of materials also includes resistively switching materials that undergo a charge transfer with a connected electrode in response to an application of an electric field. Suitable materials for the electrode include metals like Cu, Au, Ag etc.

Generally, these materials referred to as charge-transfer complexes are electron-donor-electron-acceptor complexes that are characterized by at least one electronic transition to an excited state in which there is a partial transfer of an electronic charge from the donor to the acceptor moiety.

Donor and acceptor molecules in the charge transfer complex are so defined that the highest occupied molecule orbital (HOMO) of the donor and the lowest unoccupied molecule orbital (LUMO) of the acceptor are close enough with each other that upon application of an electric field an electron of the HOMO of the donor can transfer to the LUMO of the acceptor and vice versa depending on the electric field direction.

Donor molecules are molecules that donate electrons during the formation of the charge transfer complex.

Donor molecules can include one or more of the following donor groups without being restricted thereto: O$^-$, S$^-$, NR$_2$, NAr$_2$, NRH, NH$_2$, NHCOR, OR, OH, OCOR, SR, SH, Br, I, Cl, F, R, Ar. They can be single molecules, oligomers or polymers.

The resistively switching material can also comprise a donor molecule of one of the following formulas without being restricted thereto:

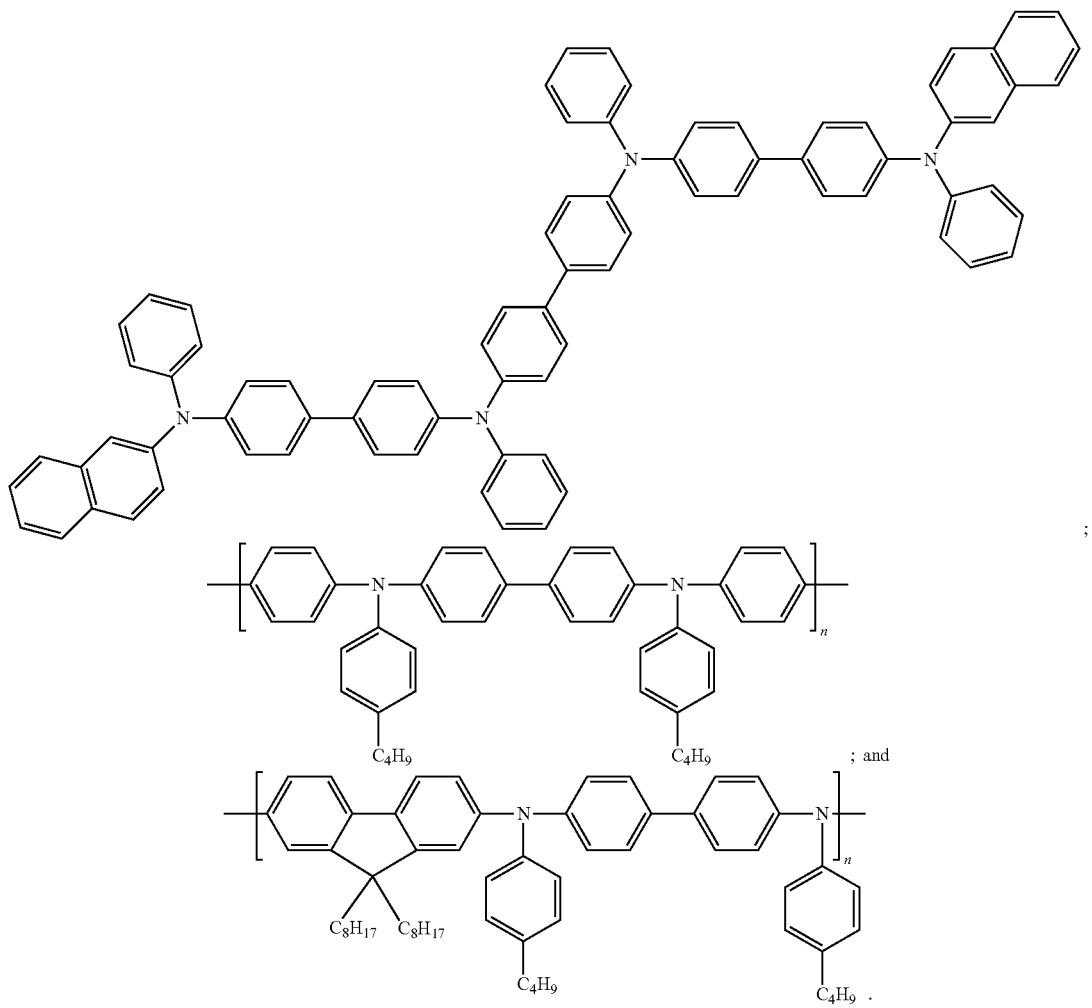

Acceptor molecules are molecules that accept electrons during the formation of a charge transfer complex.

Acceptor molecules can contain one or more of the following acceptor groups without being restricted thereto: $NO_2$, CN, COOH, COOR, $CONH_2$, CONHR, $CONR_2$, CHO, COR, $SO_2R$, $SO_2OR$, NO, Ar. They can be single molecules, oligomers or polymers.

Acceptor molecules are found also among the fullerene derivatives, semiconductor nanodots and electron poor transition metal complexes.

The resistively switching material can comprise an acceptor molecule of the group comprising C60 fullerene, C61 fullerene, CdSe, and platinum octaethyl porphine.

Alternatively, the resistively switching material undergoing a charge transfer in response to an application of an electric field can be a material having conjugated main-chain as well as sidechain liquid crystalline polymers which can be aligned in mono-domain or multi-domain structures.

The resistively switching material can have the following formula without being restricted thereto:

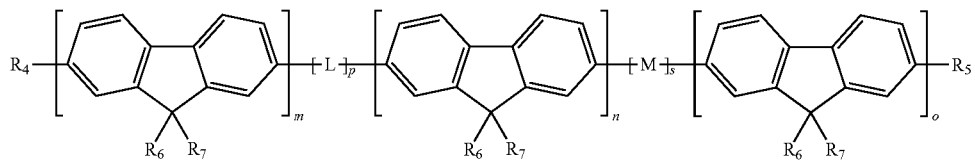

wherein R4 and R5 are independently at each occurrence selected from the group comprising:

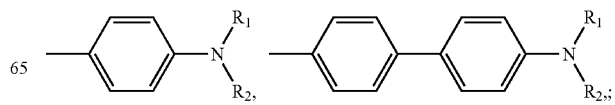

-continued

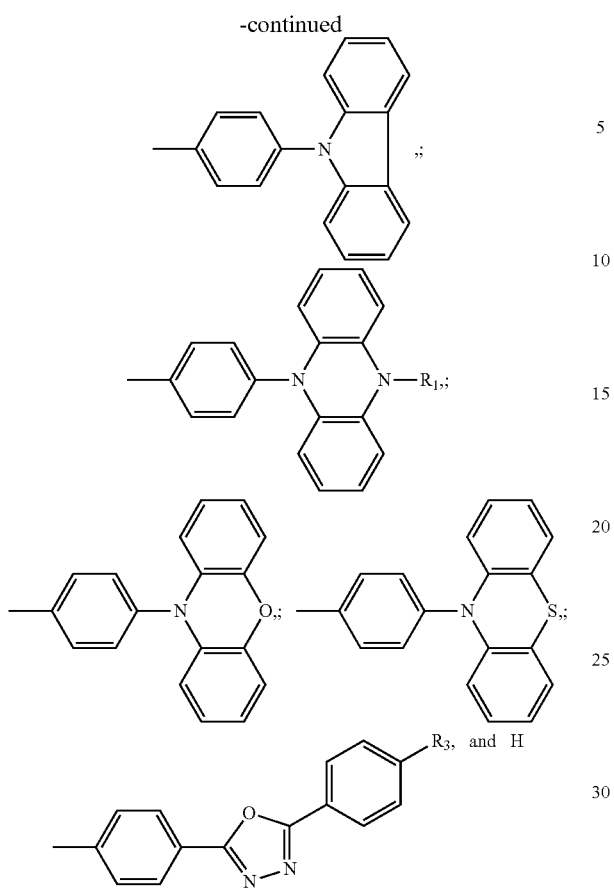

R1 and R2 being independently selected from the group comprising straight chain $C_{1-20}$ alkyl, branched $C_{1-20}$ alkyl, aryl, substituted aryl, alkylaryl, substituted alkylaryl, alkoxyaryl, substituted alkoxyaryl, aryloxyaryl, substituted aryloxyaryl, dialkylaminoaryl, substituted dialkylaminoaryl, diarylaminoaryl and substituted diarylaminoaryl, R3 being selected from the group comprising straight chain $C_{1-20}$ alkyl, branched $C_{1-20}$ alkyl, aryl, substituted aryl, alkylaryl and substituted alkylaryl, and wherein R6 and R7 are independently at each occurrence selected from the group comprising straight chain $C_{1-20}$ alkyl, branched chain $C_{1-20}$ alkyl, aryl, substituted aryl, alkylaryl, substituted alkylaryl, —$(CH_2)_q$—$(O$—$CH_2$—$CH_2)_r$—$O$—$CH_3$, q being selected from the range $1<=q<=10$, r being selected from the range $0<=r<=20$, and wherein L and M are independently at each occurrence selected from the group comprising thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $m+n+o<=10$, each of m, n, o being independently selected from the range 1-1,000, and wherein p is selected from the range 0-15, and wherein s is selected from the range 0-15, with the proviso that, if R4 is H, R5 is not H, and if R5 is H, R4 is not H.

Alternatively, the resistive switching material can have the following formula without being restricted thereto:

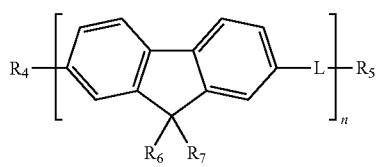

wherein L independently at each occurrence is selected from the group consisting of thiophene, substituted thiophene, phenyl, substituted phenyl, phenanthrene, substituted phenanthrene, anthracene, substituted anthracene, any aromatic monomer that can be synthesized as a dibromo-substituted monomer, benzothiadiazole, substituted benzothiadiazole, perylene and substituted perylene, and wherein $R_6$ and $R_7$ are independently at each occurrence selected from the group consisting of straight chain $C_{1-20}$, branched chain $C_{1-20}$ alkyl, aryl, substituted aryl alkylaryl, —$(CH_2)_q$—$(O$—$CH_2CH_2)_r$—$O$—$CH_3$, q being selected from the range 1-10, r being selected from the range 0-20 and wherein R4 and R5 are independently at each occurrence selected from the group comprising:

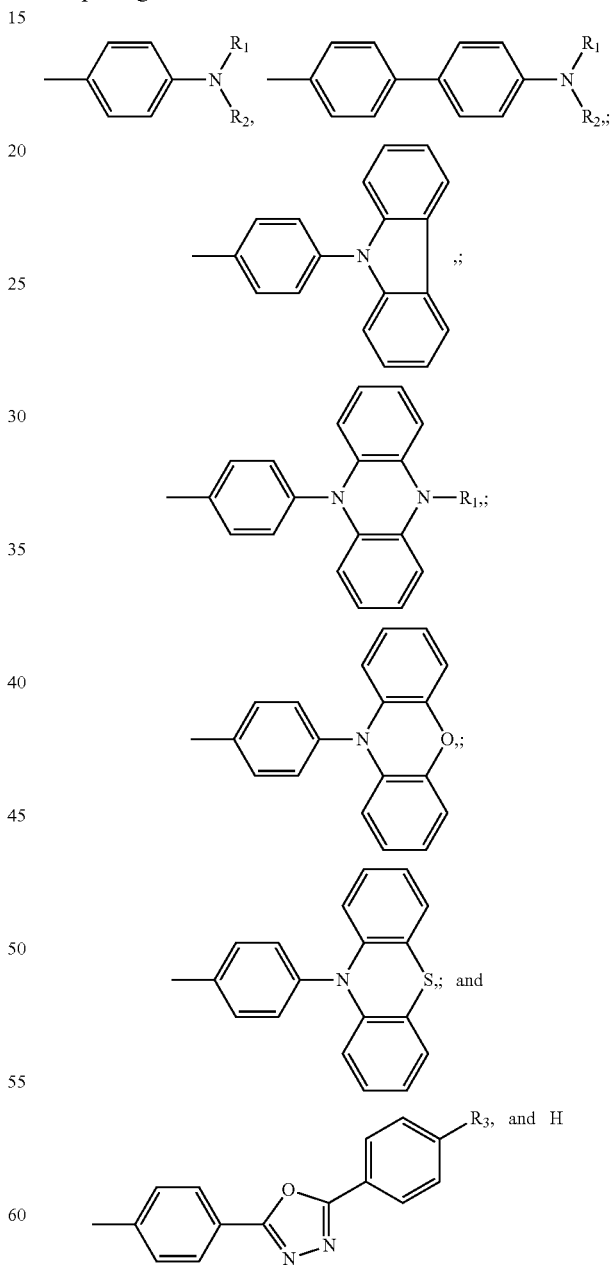

According to another alternative the resistively switching material can have one of the following formulas without being restricted thereto:

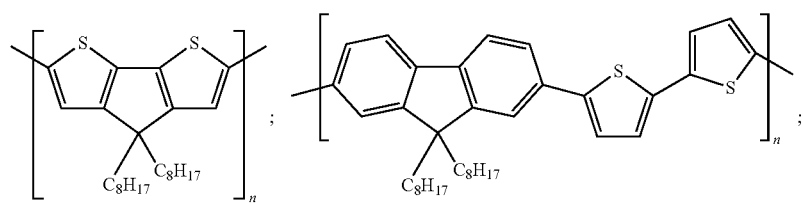
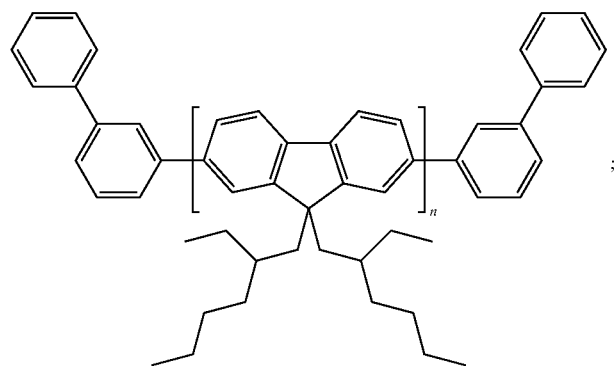
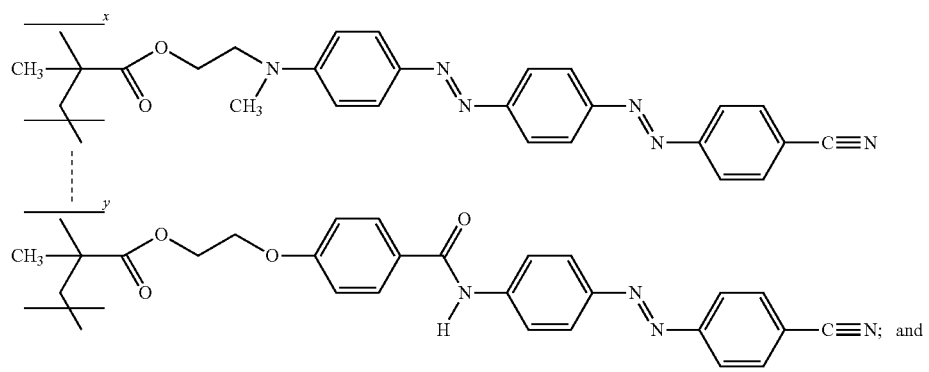
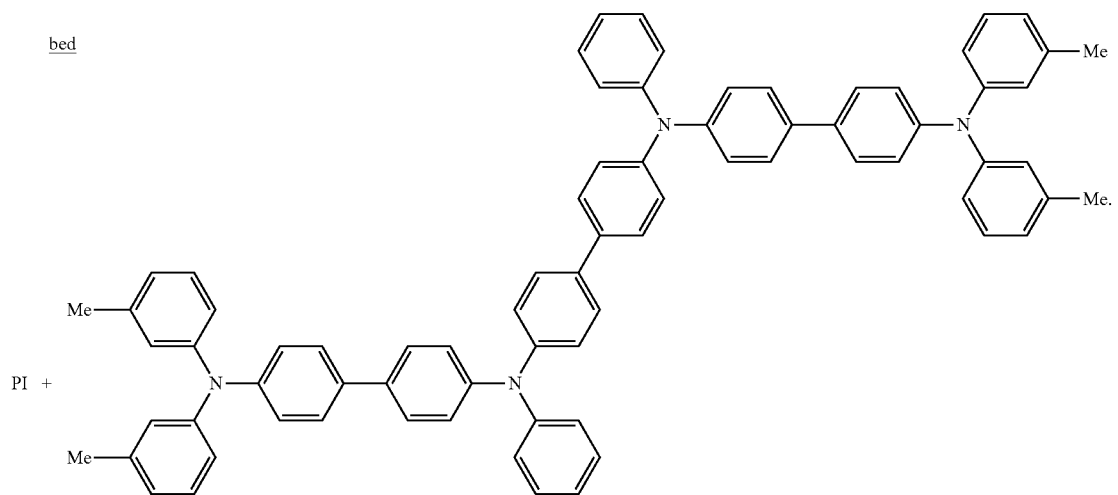

Alternatively, the resistive switching material can be an endcapped polyfluorene of the formula without being restricted thereto:

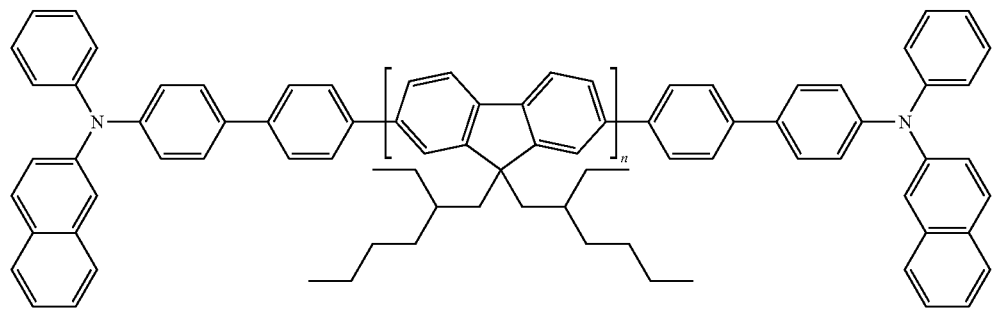

Preferably, the material is aligned on a substrate by the use of alignment layers or by other methods such as direct mechanical rubbing, by using an electric field or magnetic field. The alignment results in dipole reorientation and a better charge transfer from the electrode or between the layer components.

For all resistive switching materials described above exhibiting a charge transfer in an electric field, the charge transfer may occur intramolecular or intermolecular to the molecules of the material. A charge transfer may also occur between a molecule and a connected electrode such as the first or second electrode or one of the electrode bridge pieces the material is in contact with.

In an intramolecular charge transfer complex the donor and the acceptor moiety are part of the same molecule. The intramolecular charge transfer molecule can be a single molecule, an oligomer or polymer.

Furthermore, the resistive switching material can also include an electron poor molecule. Generally, electron poor molecules are molecules with electron withdrawing groups (with positive Hammett, δ, constant) and any electron donor groups and transition metal complexes with ligands having electron withdrawing groups directly attached to the metal. They can be single molecules, oligomers or polymers.

The electron poor molecules may be defined by one of the following formulas without being restricted thereto:

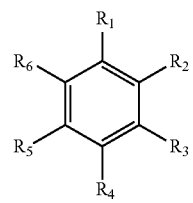

wherein R, $R_1$, $R_2$, $R_3$, $R_4$, $R_5$, $R_6$=C=O, COOH, F, Cl, Br, I, CN, $NO_2$, $NR_3^+$, O—Ar, COOR, OR, COR, SH, SR, $CONH_2$, CONHR, $CONR_2$, CHO, OH, $SO_2R$, $SO_2OR$, NO, C≡CR, Ar; and

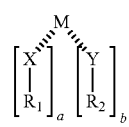

wherein M=transition metal, X, Y=electron withdrawing group like C=O, COOH, F, Cl, Br, I, CN, $NO_2$, $NR_3^+$, N=C, O—Ar, COOR, OR, COR, SH, SR, $CONH_2$, CONHR, $CONR_2$, CHO, C=N, OH, $SO_2R$, $SO_2OR$, NO, C≡CR, Ar and $R_1$, $R_2$=aromatic, allilylic; a, b=integer number.

The electron poor molecule may comprise one of the following formulas without being restricted thereto:

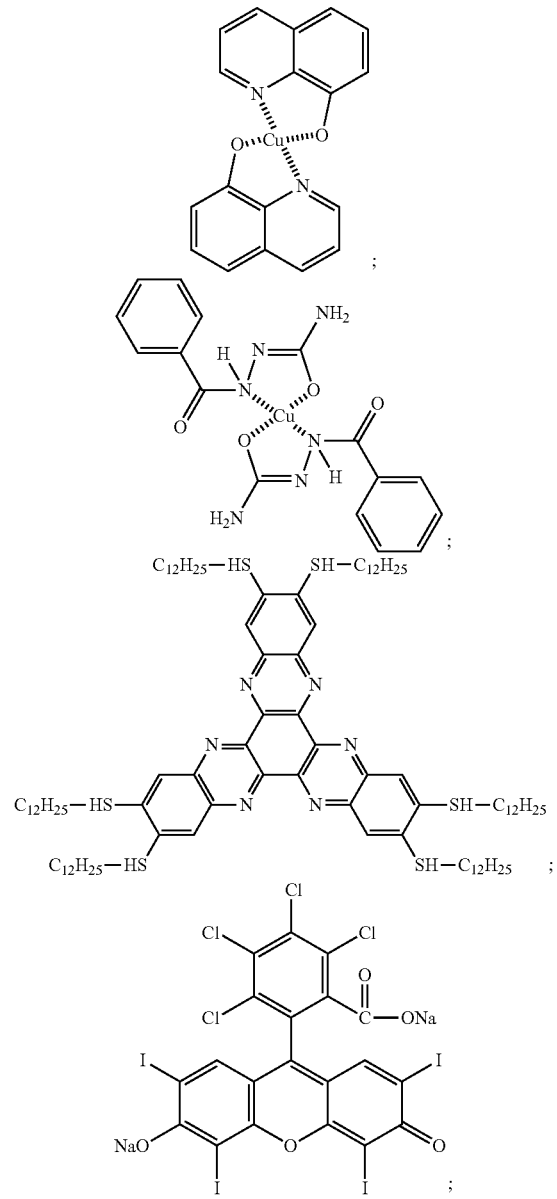

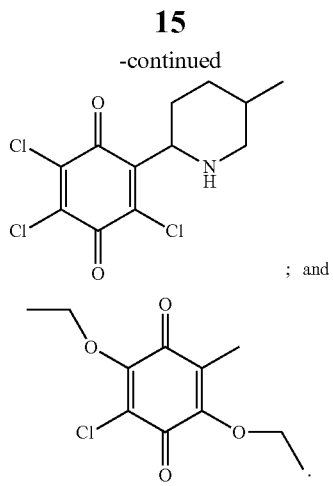

; and

The resistive switching material may comprise a Redox-addressable molecule. Generally, redox addressable molecules are molecules in which the conjugation length and with it the conductivity changes upon chemical reduction or oxidation. They can be single molecules, oligomers or polymers. A typical redox addressable group are the 4,4'bipyridinium salts.

According to one embodiment the Redox-addressable molecules are defined by the formula without being restricted thereto:

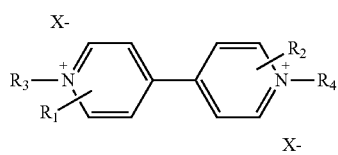

wherein $R_1$, $R_2$, $R_3$, $R_4$=aryl or alkyl $X^-$=anion.

According to a preferred embodiment the Redox-addressable molecule comprises one of the formulas without being restricted thereto:

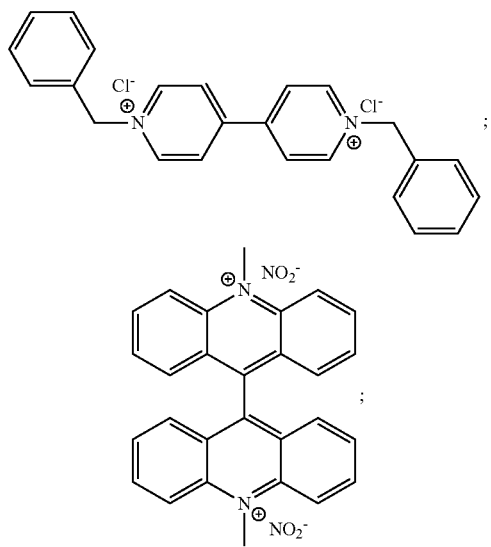

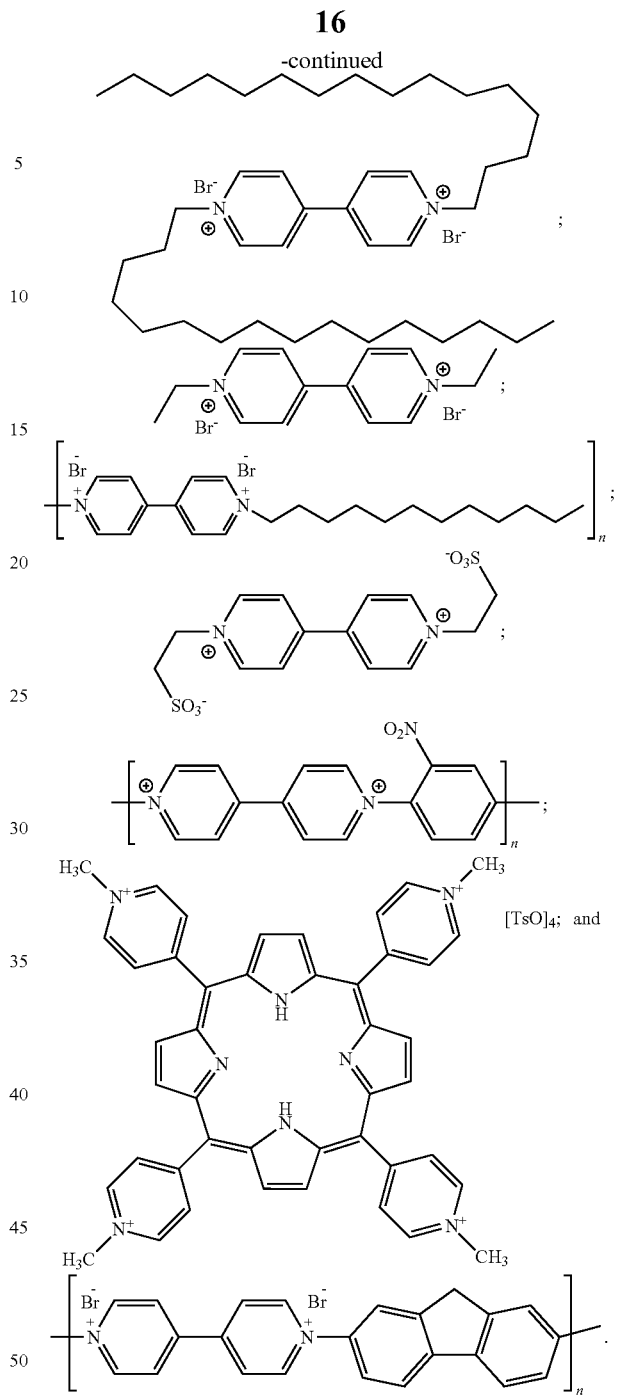

The layer of resistive switching material is usually amorphous and can easily be deposited on a substrate by using conventional deposition methods such as thermal evaporation, sputtering or spin-coating, by layer by layer deposition, electrostatic self-assembly and Langmuir Blodgett technique etc.

A specific example of a material comprising electron poor molecules are active films of hexaazatrinaphthylene (HATNA) prepared by spin coating of a chloroform solution. The films can be dried under vacuum conditions. Then Aluminium electrodes may be deposited thought a mask (0.25 mm$^2$) to form a complete switch.

Under application of a voltage profile an ON-OFF ratio of 2.3 within 20 cycles could be measured in an experimental setup.

In a redox addressable molecule the injection of electrons by an electric current chemically reduces the molecule and the increased amount of electrons in the π*orbitals increases the conductivity of the material which is transferred from a low conduction state (OFF) to a high conduction state (ON).

Further specific examples of resistive switching materials include a layer of Redox-addressable octadecyl viologen dibromide prepared for example by Langmuir Blodgett technique, a layer of Redox-addressable poly(viologen-co-dodecane) prepared by spin coating of a chloroform/ethanol solution; and a layer of Redox-addressable 1,1'-diethyl-4,4'bipyridinium dibromide prepared by evaporation. Of course these materials can also be prepared with a technique that was indicated in relation with another material.

Further details with respect to materials that can be used as a resistive switching material and their preparation are disclosed in the European patent application EP 07 01 57 11 that is hereby incorporated by reference.

As described above a resistive switching material comprises two stable states which differ in the electric resistance of the layer. In the case of a charge transfer complex material the process of a conductivity change between the components of the charge transfer complex upon application of an electric field can be explained as follows on a molecular scale: In a low-conductivity state, charge carriers such as electrons occupy the lowest energy levels. Due to an application of an electric field such as a voltage pulse electrons are transferred from a donor molecule to an acceptor molecule. As a result, charge carriers occupy higher energy levels. Thus the material is in a state of high conductivity.

According to one embodiment the first electrode and the second electrode each comprise a geometry of a strip. Both electrodes can be arranged in a way so that their strips cross each other. The strips can cross each other at an angle of 90 degrees, but other angles can be suitable as well.

According to another embodiment the resistive switching material of the first or second resistive switch is arranged outside the area in which the first and second electrodes cross and overlap each other.

According to a further embodiment the microelectronic device comprises an isolator material arranged between the first electrode and the second electrode at a location that includes the area in which the first and the second electrode cross each other. The first resistive switch and the resistivity structure can be located in the same layer as the isolator material and next to each other. The first resistive switch and the resistivity structure can be connected in parallel with each other. Furthermore, the first resistive switch and the resistivity structure can be connected to the first electrode and to the second electrode. Hence, in contrast to known resistive switches, the resistive switching material is not arranged or sandwiched directly between the electrodes of the cross bar structure, but is laterally displaced from the area where the electrodes cross each other. Examples for isolator materials include SiO2, silicon nitride, silicon-oxy-nitride and others.

According to another embodiment the microelectronic device comprises at least one of a first electrode bridge piece and a second electrode bridge piece. The first electrode bridge piece is formed on the substrate next to the first electrode. The second electrode bridge piece is formed over the layer including the first resistive switch and the resistivity structure and is located next to the second electrode.

The first electrode bridge piece and the second electrode bridge piece can be formed in the layer of the first electrode and of the second electrode, respectively. Furthermore, the first electrode bridge piece and of the second bridge piece can comprise the shape of a strip and can extend parallel to the first electrode and the second electrode, respectively. The first electrode bridge piece can be arranged to electrically connect the first resistive switch and the resistivity structure with each other and the second electrode bridge piece can be arranged to electrically connect either the first resistive switch or the resistivity structure with the first electrode. The first electrode bridge piece can be formed together with the first electrode on the substrate and the second electrode bridge piece can be formed together with the second electrode on the layer including the first resistive switch and the resistivity structure in a common fabrication step. Preferably, the first electrode bridge piece and the second electrode bridge piece each comprise a length that is shorter than the length of the first or the second electrode. While the first electrode bridge piece and the second electrode bridge piece extend only within a dimension that is shorter than the distance between two memory crosspoints, the electrodes have a length to connect several memory crosspoints.

According to a further embodiment, one of the electrode bridge pieces can be omitted. In particular, the electrode bridge piece can be omitted in a structure where one of the first resistive switch and the resistivity structure is formed directly between the first electrode bridge piece and the first electrode and in contact with them. Such a structure can be achieved, for example, by providing the first electrode bridge piece and the first electrode with extensions that extend in a vertical direction from each of the first electrode bridge piece and the first electrode and sandwiching between them a resistive switching material or a semiconductor material.

According to yet another embodiment the electrodes include nanoparticles in contact with the resistive switching material. The nanoparticles can be formed of a metal. The nanoparticles can cause a concentration or focusing of the electric field in a resistive switching material that is in contact with the nanoparticle. The nanoparticles can be used in combination with electrodes that are made of organic conductors such as polyacenes.

In particular, the resistive switching material in at least one of the first resistive switch and the second resistive switch can be positioned between two or several nanoparticles, for example, between two single nanoparticles provided on top and at the bottom of the resistive switching material. The nanoparticles on each side of the resistive switching material can be connected with an electrode provided over or under the resistive switching material. The nanoparticles can have, for example, a spherical shape to focus or concentrate an electric field in the resistive switching material between two nanoparticles that are arranged on two opposite sides of the resistive switching material and in contact with it.

Instead of providing nanoparticles on top and at the bottom of a resistive switching material, one or more nanoparticles can be arranged on two sides of a resistive switching material in a horizontal direction. Based on three nanoparticles of different materials or metals arranged on a substrate next to each other and by providing a resistive switching material between respective two nanoparticles a complementary resistive switch comprising two anti-serially coupled resistive switches can be provided. The outer two nanoparticles can be contacted by arranging one of the nanoparticles on the first electrode and by depositing the second electrode on top of the other nanoparticle, while the middle nanoparticle can be contacted by providing an electrode bridge piece on top or at the bottom of the nanoparticle.

Instead of using three different metals the outer nanoparticles or all nanoparticles in the complementary resistive switch described above can be made of the same material.

Furthermore, it may be conceived to replace the middle nanoparticle by two nanoparticles that are connected by an electrode bridge piece.

According to another embodiment the nanoparticles can be replaced by other structures such as small rods or chunks of metal that may be placed on or under one of the electrodes or electrode bridge pieces.

Moreover, a complementary resistive switch including two anti-serially coupled resistive switches or a device that includes a combination of a resistive switch and a diode can be made by providing a vertically oriented structure in combination with a horizontally oriented structure in a single layer of the device. The vertically oriented structure may comprise a resistive switching material or a semiconductor material vertically arranged between an electrode and an electrode bridge piece. Additionally, one or several nanoparticles can by arranged between the resistive switching material and one or both of the electrode and the electrode bridge piece. The horizontally oriented structure may comprise a resistive switching material or a semiconductor material horizontally arranged between two nanoparticles, rods or chunks of material such as metal that are connected with one of the electrodes and with the vertically oriented structure or the electrode bridge piece.

Furthermore, according to the disclosure a method of fabricating a microelectronic device is provided. The method comprises forming a first electrode on a substrate, forming a first resistive switching material and a resistivity structure in a same layer of the device including de-positing a resistive switching material on the substrate, forming a second electrode above the layer including the first resistive switching material and the resistivity structure, wherein the first electrode and the second electrode are in contact with the first resistive switch and the resistivity structure.

Preferably, the microelectronic device is formed such that the first electrode is in electrical contact with one of the first resistive switching material and the resistivity structure, and the second electrode is in electrical contact with the other of the first resistive switching material and the resistivity structure, wherein the first resistive switching material and the resistivity structure are serially connected to each other. The resistivity structure provides a high current resistivity in at least one direction of current flow.

A microelectronic device fabricated in this way can be operated with a reduced sneak current flowing through a memory crosspoint. This is achieved due to the resistivity structure that is connected between the electrodes in such a way and orientation that a sneak current through the resistive switch is suppressed or reduced independent of whether the resistive switch is in a state of high conductivity or in a state of low conductivity, i.e. independent of whether a binary "1" state or binary "0" state is stored in the memory device. This permits to unambiguously address memory crosspoints in an array of resistive switches.

Furthermore, the forming of the first resistive switching material and of the resistivity structure in a same layer side by side provides advantages for the fabrication process. Since substantially only a single layer is modified compared to a memory device without the resistivity structure, the fabrication method does not involve a high additional complexity. Furthermore, error prone asymmetries in the fabrication process can be avoided, that may arise due to an inclusion of two or more stacked layers of resistive switching material.

According to one embodiment the forming of the resistivity structure comprises forming of a second resistive switch that is anti-serially connected with the first resistive switch. The first and the second resistive switch are preferably formed in a single layer of the device. Forming of a pair of anti-serially connected resistive switches results in a complementary resistive switch that can be operated during a change of the memory states from "1" to "0" or "0" to "1" in such a way that at least one of the complementary resistive switches remains in a state of high resistivity. Sneak currents through the device can be suppressed or reduced, since a voltage applied between two electrodes essentially drops over the resistive switch of the two resistive switches that is in a state of high resistivity.

According to another embodiment the forming of the resistivity structure comprises forming of a rectifying diode such as a Schottky diode. The forming of a diode may include depositing of a semiconductor material as the resistive switching material and depositing of a metal on the semiconductor material in order to provide a metal-semiconductor junction.

According one embodiment the depositing of the semiconductor material includes a semiconductor material that has properties that make it suitable for a use as a resistive switching material. Furthermore, the depositing of the metal to form a metal-semiconductor junction can be a part of the forming of an electrode or a contact to the first resistive switching material. Hence, an integrated resistive switch comprising rectifying properties of a diode can be provided.

According to a further embodiment the method includes forming a first electrode bridge piece next to the first electrode on the substrate. The electrode bridge piece can have the shape of a strip and can be formed in a way so that it extends in parallel to the first electrode. The method may further include forming at least one of the first resistive switch and the second resistive switch over the first electrode bridge piece. Preferably, one of the first resistive switch and the second resistive switch is formed between the first electrode bridge piece and the second electrode in an area where the first electrode bridge piece and the second electrode cross each other.

According to another embodiment the method further comprises forming an isolator between the first electrode and the second electrode in an area where the first electrode and the second electrode cross each other.

According to yet another embodiment the method further comprises forming a via in contact with the first electrode, the via being formed in the same layer in which the first resistive switching material and the resistivity structure are formed. Preferably, the via, the first resistive switching material and the second resistive switching material are formed on the substrate having the first electrode and optionally the first electrode bridge piece provided thereon before forming the second electrode. Furthermore, the first resistive switching material and the second resistive switching material can be formed on the substrate after forming the isolator and the via. The forming of the different above mentioned structures in a single layer can be achieved by using photoresist masking and etching steps.

According to one embodiment the method further comprises forming a second electrode bridge piece in contact with the via and in contact with one of the first resistive switching material and the resistivity structure. According to a further embodiment, the method includes depositing electrodes made of metals. The electrodes can be formed by deposition steps including a use of photoresist masks. Depending on the inorganic or organic resistive switching material used for the resistive switches, the electrodes can be formed with the same material or with different materials such as metals having different work functions.

According to yet another embodiment the method further comprises forming one or several nanoparticles arranged between a resistive switching material of the first resistive switch and a resistive switching material of the second resistive switch and at least one of the first electrode, the second electrode, the first electrode bridge piece, and the second electrode bridge piece. Nanoparticles can be used in combination with organic conductive materials for the electrodes such as polyacenes.

Nanoparticles with the shape of a sphere can effect a concentration of the electric field in an area where the distance between the nanoparticle and an electrode or between the nanoparticle and another nanoparticle is the shortest. The shortest distance between two nanoparticles can be defined for example between the opposite poles of the nanoparticles.

According to another embodiment, the method comprises forming the first resistive switch and the second resistive switch with a single piece of resistive switching material that is formed or deposited on the first electrode bridge piece, forming the second electrode over a first part of the resistive switching material to form a first resistive switch, and forming a second electrode bridge piece in contact with a second part of the resistive switching material to form a second resistive switch.

Instead of forming the resistive switching material between an electrode and an electrode bridge piece in order to form a resistive switch or a diode that comprises a vertical structure it may be conceived to form one or more horizontally extending structures such resistive switches or diodes by depositing the elements side by side on the substrate.

According to one embodiment one of the resistive switches may be formed by forming extensions in connection with one of the first electrode or the first electrode bridge piece that extend vertically from the first electrode or the first electrode bridge piece, respectively, and to arrange the resistive switching material between the extensions to form a horizontally oriented resistive switch or diode. The extensions can be formed by blocks or rods made of the same material as the electrode it is connected with.

According to another embodiment, a further extension is formed that extends vertically from the second electrode and is in connection with the second electrode. By forming or depositing resisitive switching material between all three extensions two anti-serially connected resistive switches can be obtained that each are oriented or extend in a horizontal direction. The extensions as well as the connected electrodes can be made of two or more different materials.

The extensions can also be formed by a single spherical nanoparticle. Furthermore, one or several of the single nanoparticles can be replaced by two or more nanoparticles that are connected with each other, for example, by an electrode bridge piece.

According to yet another embodiment the method includes forming the first electrode and the first electrode bridge piece on the substrate with the shape of strips that extend in parallel to each other.

According to yet another embodiment, the method includes forming the second electrode as a strip crossing at least the first electrode and optionally crossing the first electrode bridge piece.

According to a further embodiment, the method further includes forming or depositing of a resistive switching material by spinning the resistive switching material on the substrate. The forming of the resistive switching material by spinning the resistive switching material on the substrate can be done after at least one of the isolator and the via are formed.

According to yet another embodiment the method includes depositing electrodes made of inorganic or organic conductors by a printing technique. Furthermore, at the contact points or contact areas between the inorganic or organic conductors and the resistive switching material one or several nanoparticles can be deposited.

According to yet another embodiment, the depositing of electrodes made of inorganic or organic conductors comprises functionalizing the surface of the inorganic or organic conductors at target locations and depositing one or several nanoparticles on the functionalized surfaces at the target locations. The target locations can include locations where contacts between the electrodes and other materials such as a resistive switching material are provided and may enhance an adhesion of nanoparticles to these locations.

BRIEF DESCRIPTION OF THE DRAWINGS

Further advantages, features and characteristics of the disclosure will result from the following description of embodiments of the disclosure in combination with the drawing, in which.

DETAILED DESCRIPTION OF THE EMBODIMENTS

In the following, the disclosure will be described by means of embodiments thereof referring to the figures.

Figure 1:
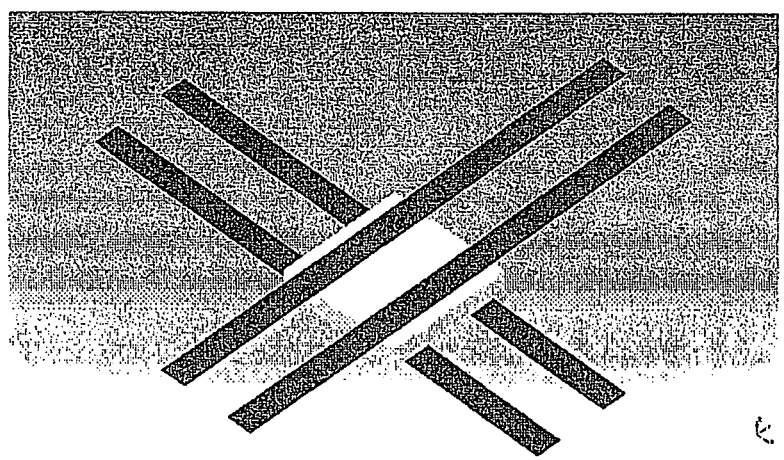
FIG. 1 shows a memory device of prior art having a cross bar structure and 2×2 memory storage devices at the cross points between the electrode strips.
Figure 2:
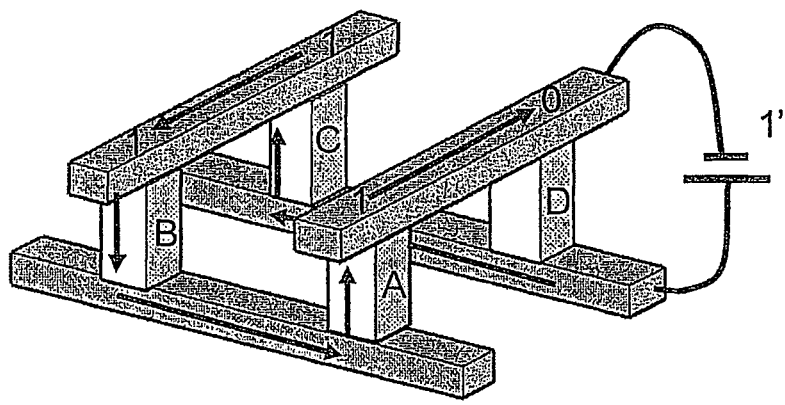
FIG. 2 shows a perspective schematic view of the 2×2 memory device according to FIG. 1 illustrating sneak currents.
Figure 3:
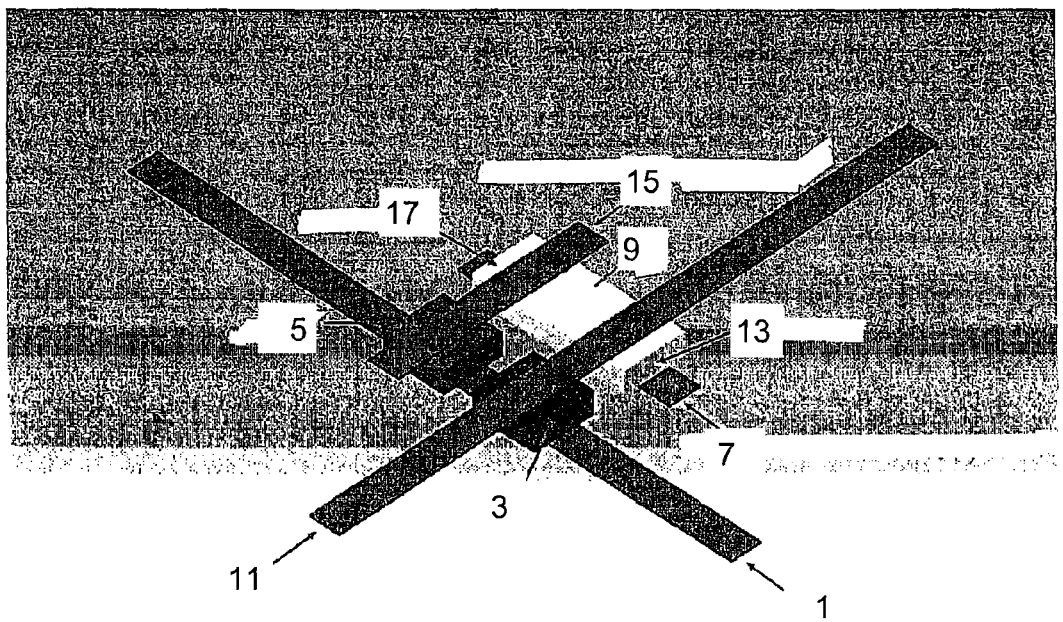
FIG. 3 a memory device according to a first embodiment of the disclosure.

FIG. 3 shows a memory device according to a first embodiment of the disclosure. The memory device comprises as a first electrode a strip bottom electrode 1 on which an isolator 3 and a via 5 are arranged side by side. In parallel to the bottom electrode 1, a bottom electrode bridge piece 7 is formed as a first electrode bridge piece. On top of bottom electrode bridge piece 7 a piece of a resistive switching material 9 is provided. The piece of resistive switching material 9 is formed in the same layer as the isolator 3 and the via 5. On top of the isolator 3 and the piece of resistive switching material, a second electrode is provided as a top electrode 11. The top electrode 11 has the shape of a strip and extends perpendicular to bottom electrode 1 over the isolator 3 and a part of the resistive switching material 9. The top electrode 11 and bottom electrode 1 sandwich the isolator 3 between them at their crossing point, and top electrode 11 and bottom electrode bridge piece 7 sandwich between them a part of the resistive switching material 9 and form a first resistive switch 13. A top electrode bridge piece 15 extends in parallel to top electrode 11 and over via 5 and a second part of the resistive switching material 9. Where the top electrode bridge piece 13 and the top electrode bridge piece 7 sandwich the resistive switching material between them, a resistive second switch 17 is formed. The isolator 3, the via 5 and the resistive switching material 9 are formed in the same layer of the device. Between the isolator 3, the via 5 and the resistive switching material additional material such as an additional resistive switching material can be provided.

Figure 4:
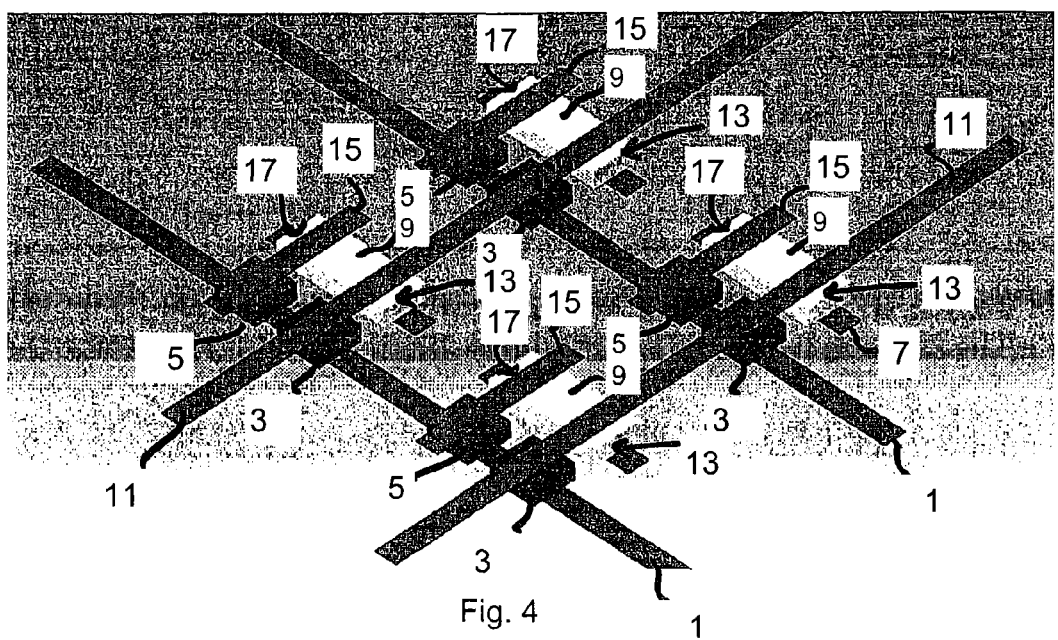
FIG. 4 an array of four memory devices connected in a cross bar array according to the embodiment of the disclosure shown in FIG. 3.

FIG. 4 shows an array of four memory devices arranged in a crossbar array. The four memory devices are identical to the memory device shown in FIG. 3.

As is visible in FIGS. 3 and 4, a first resistive switch 13 is formed by top electrode 11, resistive switching material 9 and bottom electrode bridge piece 7 in the area where the top electrode 11 and the bottom electrode bridge piece 7 overlap each other. A second resistive switch 13 is formed by top electrode bridge piece 15, resistive switching material 9 and bottom electrode bridge piece 7 in the area where the top electrode bridge piece 15 and the bottom electrode bridge piece 7 overlap each other. Both resistive switches 13, 17 are anti-serially coupled to each other by the common bottom electrode bridge piece 7 traversing the entire resistive switching material 9 including both resistive switches 13, 17.

Figure 5A:
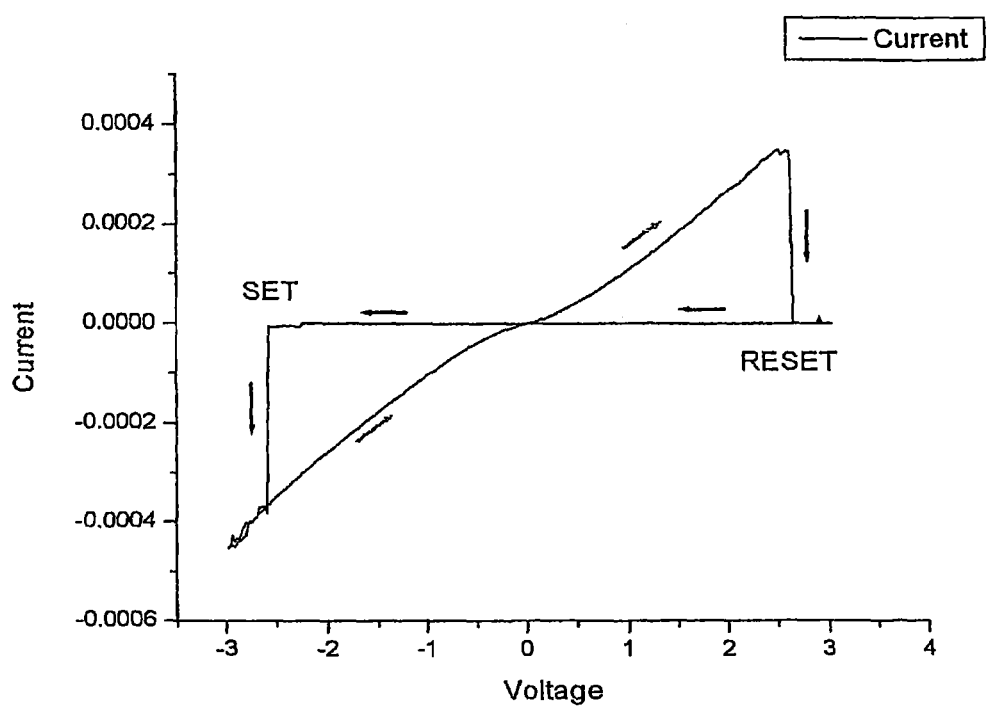
FIG. 5a, b a current-voltage-characteristic of a resistive switching material and of two anti-serially coupled resistive switches, respectively.

Each of the resistive switches 13, 17 shows a bistable switching characteristic as shown in FIG. 5a. By applying a positive voltage that is larger than a threshold voltage (in the example shown in FIG. 5a of approx. +2.7 V), the resistive switching material of the resistive switch changes into a state of high resistivity (indicated by RESET in FIG. 5a). Hence, at and above this voltage the current drops to a value close to zero. The resistive switching material remains in this state for all applied voltages above a negative threshold voltage. By applying a negative voltage that equals or exceeds the threshold voltage of (approx. −2.7 V), the resistive switching material switches back to a state of low resistivity (indicated by SET in fig. FIG. 5a). In this low resistivity state, the current varies approximately linearly as a function of the applied voltage until the positive threshold voltage is reached or exceeded that results in a transfer to the low conductivity state.

Figure 5B:
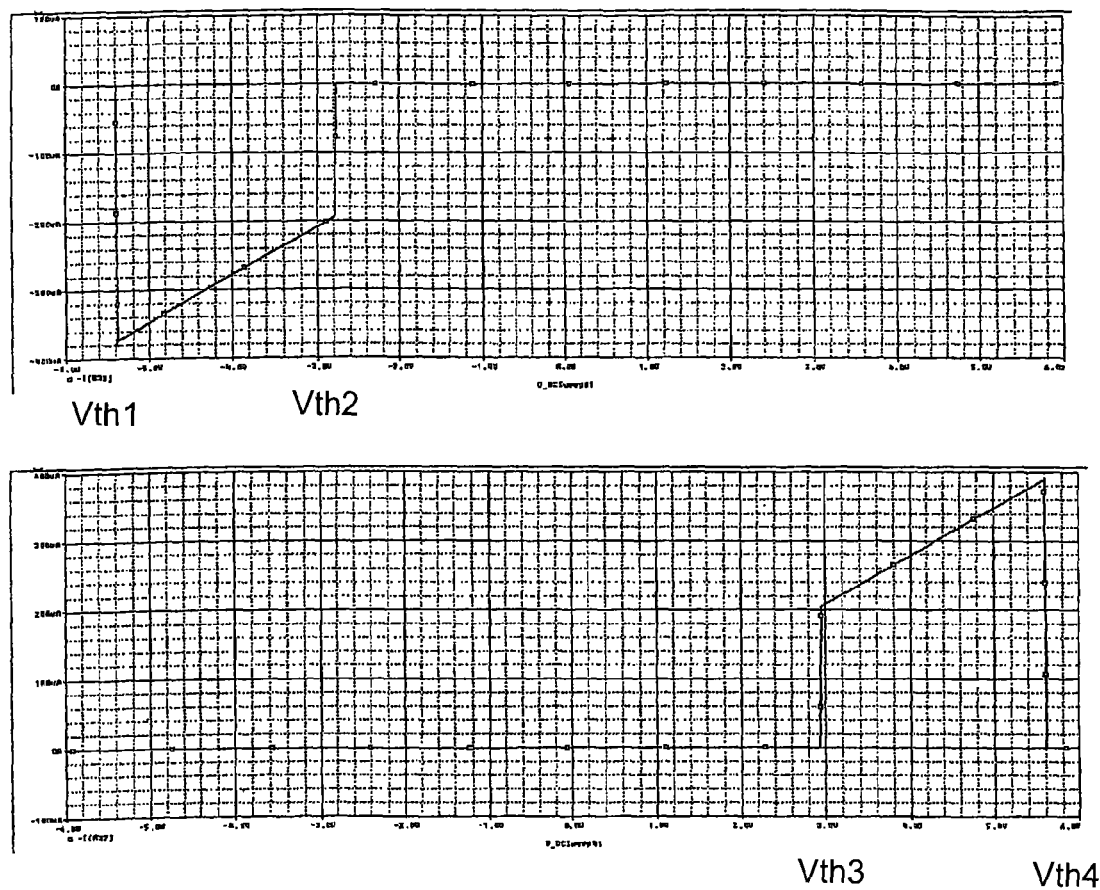

The current voltage characteristic of two anti-serially coupled resistive switches is demonstrated in FIG. 5b. FIG. 5b shows a simulation result obtained with a simulation circuit of a complementary resistive switch.

For a negative voltage between threshold voltages $V_{th1}$ and $V_{th2}$ and for a positive voltage between $V_{th3}$ and $V_{th4}$ both resistive switches of the complementary resistive switch are in a state of low resistivity and high conductivity. Accordingly, a current flows through the complementary switch. If a positive voltage is applied that is larger than the threshold voltage $V_{th4}$ of the first resistive switch, the first resistive switch transfers into a state of high resistivity, while the second resistive switch remains in a state of low resistivity. As a result, the voltage applied between bottom electrode 1 and top electrode 11 mostly drops over the first resistive switch which is in a state of high resistivity and the current flowing through the complementary resistive switch is zero or close to zero. In this state a sneak current through the memory cross point would be basically suppressed. Applying a negative voltage between bottom electrode 1 and top electrode 11 in a range between $V_{th3}$ and $V_{th4}$ has the effect that the first resistive switch is transferred into a state of low resistivity. Hence, the current flowing through the complementary resistive switch increases abruptly, since both switches are in a state of low resistivity. Applying a negative voltage larger than $V_{th1}$ effects a change of state of the second resistive switch from a state of low resistivity to a state of high resistivity, while the first resistive switch remains unaffected. Hence, the voltage between bottom electrode 1 and top electrode 11 mainly drops over the second resistive switch, and a current flowing through the complementary resistive switch such as a sneak current remains low or suppressed. Preferably, the binary states "0" and "1" are defined at voltages above $V_{th4}$ and below $V_{th1}$, respectively, at which the total resistivity of the complementary resistive switch always remains high independent of whether the complementary resistive switch is in a logical state of "0" or "1". Hence, sneak currents through complementary resistive switches can be avoided.

Figure 6:
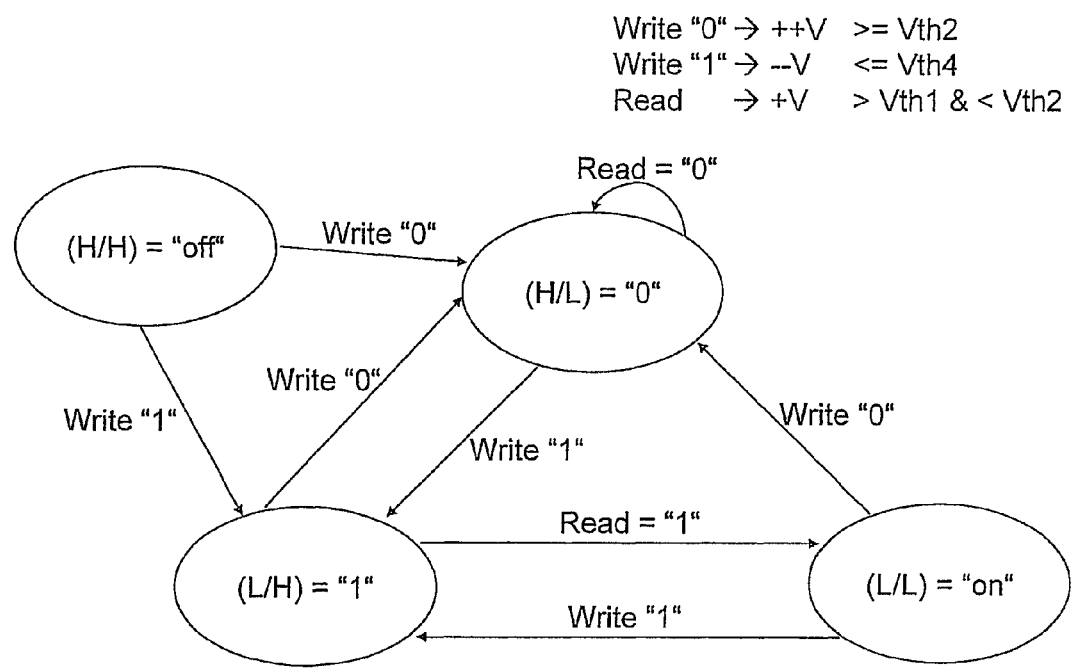
FIG. 6 shows a state diagram for a memory device according to the first embodiment.

FIG. 6 shows a state diagram of a memory device comprising a first resistive switch and a second complementary resistive switch according to an embodiment. The state diagram includes four states represented by four circles between which the memory device may transfer. The circle at the top left side of the diagram represents the "off"-state of the device. In the "off"-state both resistive switches are in a state of high conductivity indicated by (H/H). This state corresponds to the voltage ranges between $V_{th1}$ and $V_{th2}$ and between $V_{th3}$ and $V_{th4}$ in FIG. 5b. In order write a state of "0" to the memory device a positive write pulse having a voltage of more than $V_{th4}$ is applied to the electrodes of the memory device which transfers one of the complementary resistive switches into a state of low conductivity, while the other resistive switch remains in a state of high conductivity. This state that is shown in the top right side of the diagram and is represented by (H/L). From this state the memory device can be transferred to the storage state of "1" by applying a negative voltage pulse having a voltage of less than $V_{th1}$ to the electrodes. By applying this pulse the resistive switch that was in a state of low conductivity is transferred into a state of high conductivity, while the other resistive switch is transferred from the state of high conductivity into a state of low conductivity. Accordingly, this state shown in the lower left circle in the state diagram is represented by (L/H). From the state "1" the memory device can be transferred to the "on"-state shown on the bottom right side of the state diagram which corresponds to a state in which the first resistive switch and the second resistive switch are both in a state of low resistivity indicated by (L/L) in correspondence to the voltage range between $V_{th2}$ and $V_{th3}$ in FIG. 5b. This transfer occurs also during a read operation during which a read pulse is applied to the device that results in a measurable current that indicates that a state of "1" was stored in the memory device. Hence, applying the read pulse destroys the state of "1", and in order to re-establish the state it has to be re-written by applying a negative voltage of less than $V_{th1}$. From the "on"-state, the device may also transfer to the state of "0" by applying a positive voltage pulse of more than $V_{th4}$. As indicated by the arrow in the state diagram returning to the state (H/L), a read pulse for reading a state of "0" does not destroy the state which, accordingly, needs not to be rewritten after the read pulse, since the read pulse does not induce a current flow which indicates that the state stored in the memory device is "0".

Figure 7:
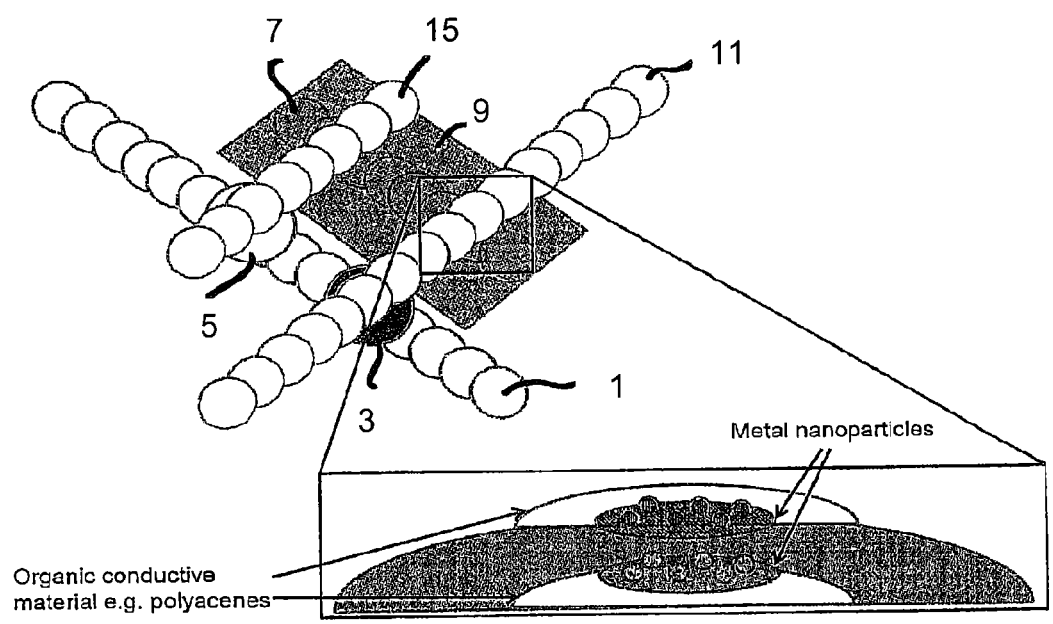
FIG. 7 shows a perspective view of a memory device according to a second embodiment of the disclosure.

FIG. 7 shows the microelectronic device according to a second embodiment of the disclosure. Elements that are similar or equal to the elements in FIG. 3 are denoted by the same reference numerals. As is visible in FIG. 7, the bottom electrode 1, the bottom electrode bridge piece 7, the top electrode 11 and the top electrode bridge piece 15 are formed by spherical particles of a conductive organic material such as polyacences instead of strips of metal such as gold, silver, copper etc. Between the resistive switching material and the bottom electrode bridge piece 7, between the resistive switching material and the top electrode 11 and the top electrode bridge piece 15 metal nanoparticles are provided. The nanoparticles can be deposited as a liquid solution. The isolator 3 and the via 5 are formed by spherical particles. The material used for the isolator 3 and the via 5 includes isolating and conductive nanoparticles, respectively. The material used for the bottom electrode 1 and the bottom electrode bridge piece 7 differs from the material used for the top electrode 11 and the top electrode bridge piece 15 in order to form the anti-serially coupled bistable resistive switches. It can be envisaged to omit the isolator 3 if the electrodes are formed in such a way that the distance between the top electrode 11 and the bottom electrode 1 is large enough to provide a sufficient isolation. The conductive organic material used as material for the electrodes can be deposited by a printing technique.

Figure 8:
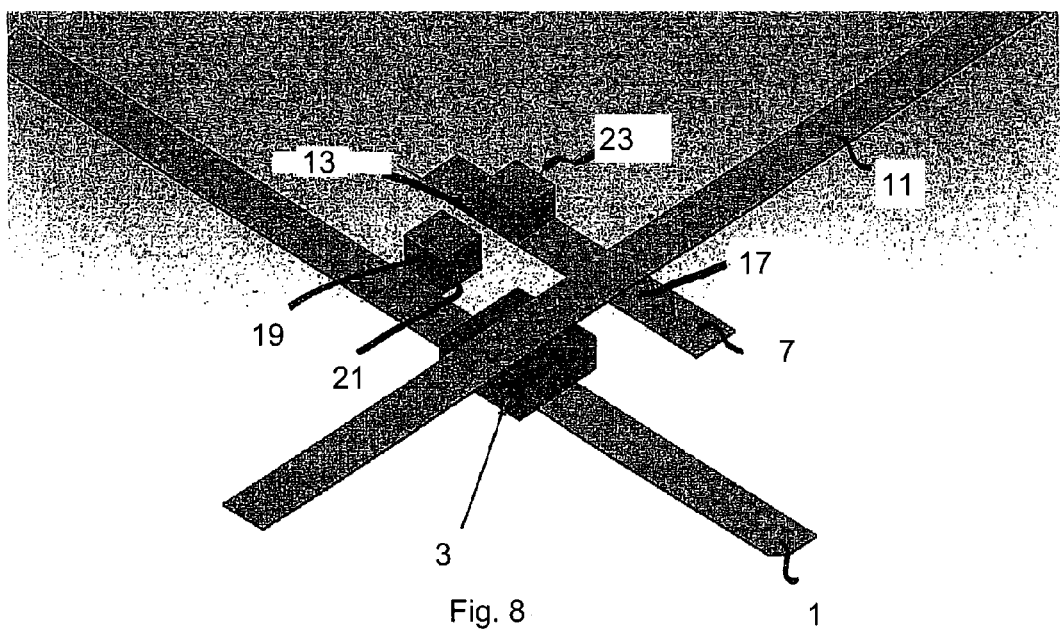
FIG. 8 shows a perspective view of a memory device according to a third embodiment of the disclosure.

A further embodiment of the memory device is shown in FIG. 8. Elements having the same functionality as the embodiment shown in FIG. 3 are denoted by the same reference numerals. Compared to the embodiment in FIG. 3, the top electrode bridge piece 15 has been omitted. In contrast to the embodiment in FIG. 3, a first conductive structure 19 having the shape of a cube is arranged adjacent to bottom electrode 1 on an extension 21 of the bottom electrode 1. On top of bottom electrode bridge piece 7 a second conductive structure 23 also having the shape of a cube has been formed opposite to the first structure 19. The space in the layer that includes the isolator 3, the first and the second conductive structure 19, 23 is filled with a resistive switching material not illustrated in FIG. 8 so that a first resistive switch 13 is formed between the first conductive structure 19 and the second conductive structure 23 that extends in a horizontal direction and a second complementary resistive switch 17 is formed between bottom electrode bridge piece 7 and top electrode 11 that extends in a vertical direction. Both resistive switches 13, 17 are anti-serially coupled by the bottom electrode bridge piece 7.

Figure 9:
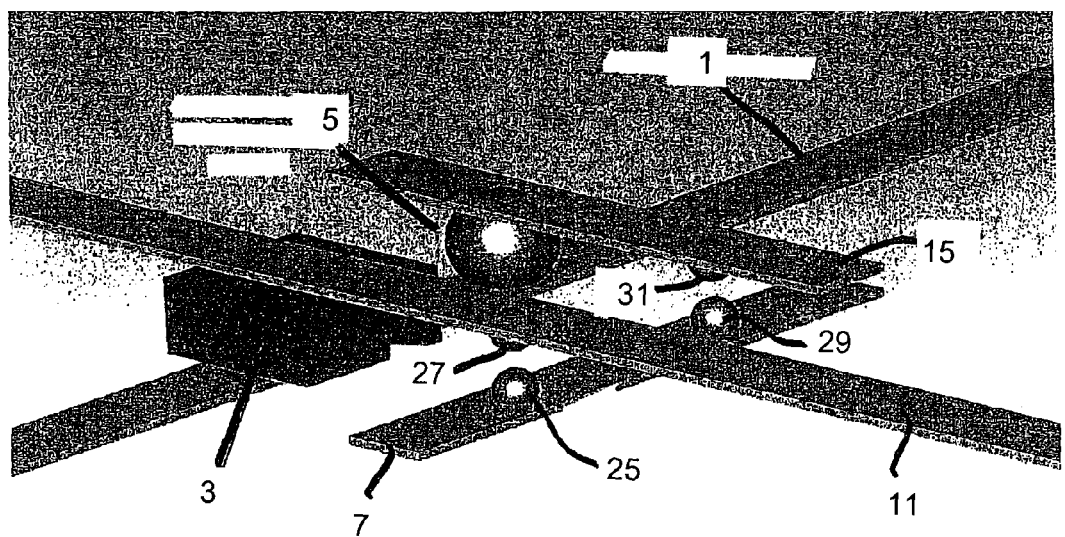
FIG. 9 shows a perspective view of a memory device according to a fourth embodiment of the disclosure.

A further memory device according to another embodiment of the disclosure is shown in FIG. 9. Elements having the same functionality as the elements in the embodiment shown in FIG. 3 are denoted by the same reference numerals. With regard to this embodiment, only differences with regard to the embodiment shown in FIG. 3 are explained in more detail. In contrast to the embodiment shown in FIG. 3, single nanoparticles 25, 29 have been provided on the bottom electrode bridge piece 7 at the positions at which the top electrode 11 and the top electrode bridge piece 15 cross the bottom electrode bridge piece 7. In addition, single nanoparticles 27, 31 have been deposited in contact with the top electrode 11 and the top electrode bridge piece 15 at positions opposite to the single nanoparticles 25, 29 on the bottom electrode bridge piece 7. The resistive switching material that is not illustrated in FIG. 9 is provided between the nanoparticles 25, 27, 29, 31, wherein the nanoparticles 25, 27, 29, 31 due to their spherical shape concentrate the electric fields applied between the opposite nanoparticles 25, 27, 29, 31. Similarly, a large single nanoparticle has been used as a via 5 between the top electrode bridge piece 15 and the bottom electrode 1. All nanoparticles 5, 25, 27, 29, 31 are made of a conductive material such as a metal.

Figure 10:
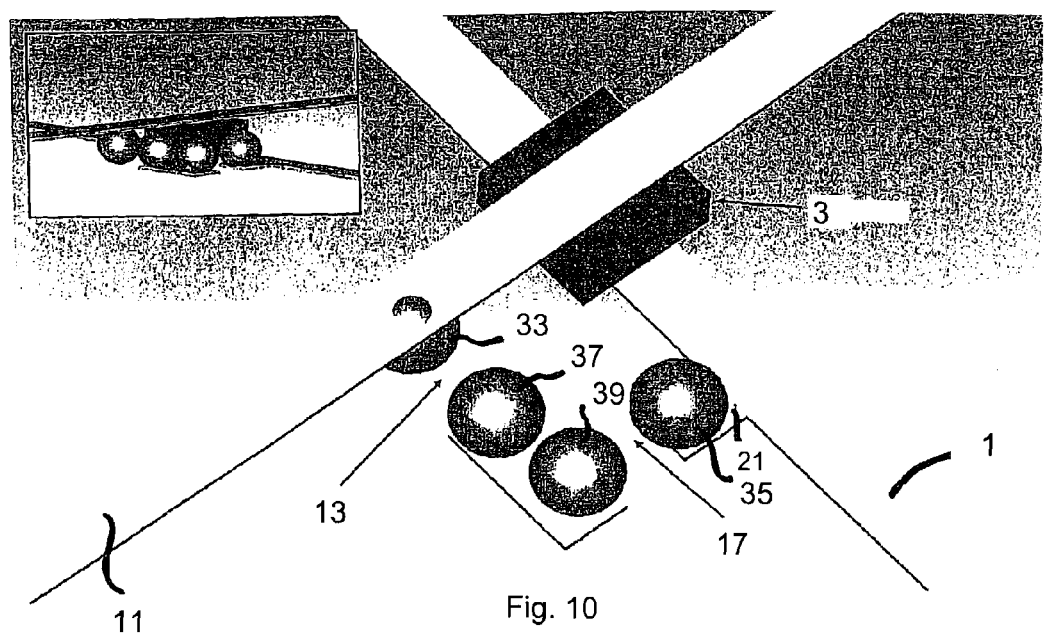
FIG. 10 shows a perspective view of a memory device according to a fifth embodiment of the disclosure.

In FIG. 10 a further embodiment of the micro electronic device is shown. Elements having the same functionality as elements in the embodiment shown in FIG. 3 are denoted by the same reference numerals. The description of the embodiment shown in FIG. 10 is mainly restricted to the differences with regard to the embodiment shown in FIG. 3. According to the embodiment in FIG. 10, the top electrode bridge piece 15 has been omitted. Furthermore, a first spherical nanoparticle 33 below and in contact with the top electrode 11 and a second spherical nanoparticle 35 on an extension 21 of bottom electrode 1 have been provided. In addition, two spherical nanoparticles 37, 39 are positioned on bottom electrode bridge piece 7. All four nanoparticles 33, 35, 37, 39 are located in the same layer of the device. A first resistive switch 13 is formed between the first spherical nanoparticle 33 connected to top electrode 11 and the second spherical nanoparticle 37 provided on bottom electrode bridge piece 7 by providing a resistive switching material between these two spherical nanoparticles 33, 37 that is not visible in FIG. 10. Furthermore, a second complementary resistive switch is positioned between the second spherical nanoparticle 39 on bottom electrode bridge piece 7 and the fourth spherical nanoparticle 35 on the extension 21 of bottom electrode 1. According to this embodiment, two complementary switches 13, 17 that are oriented essentially in a horizontal direction of the device are provided.

Figure 11:
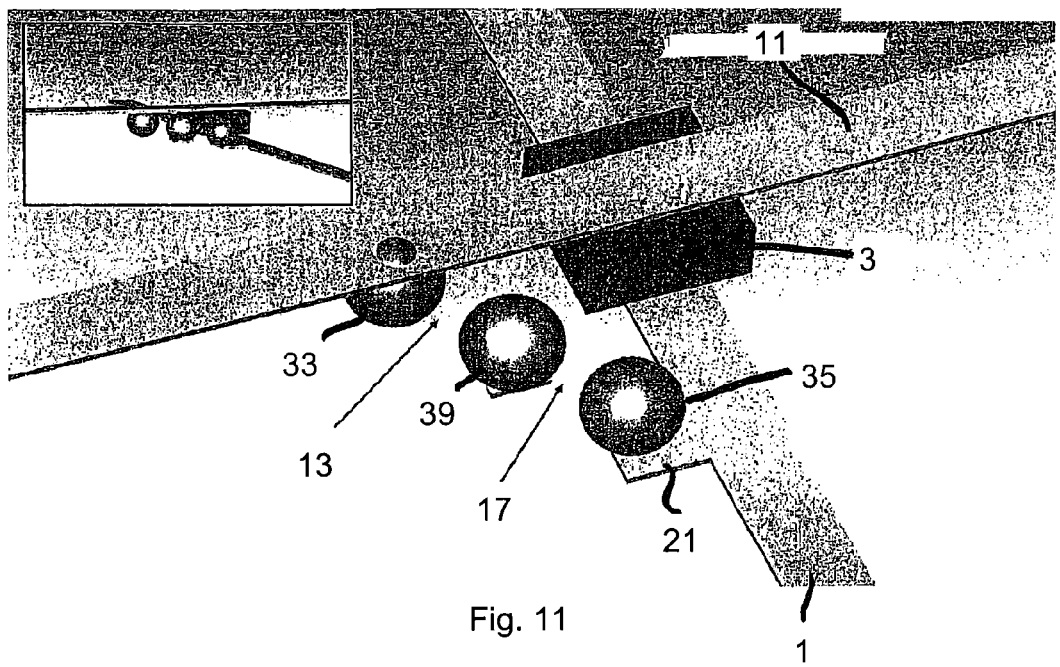
FIG. 11 shows a perspective view of a memory device according to a sixth embodiment of the disclosure.

Yet, another embodiment of a micro electronic device according to the disclosure is shown in FIG. 11. Elements having the same functionality as elements in the preceding embodiments and in the embodiment shown in FIG. 3 are denoted by the same reference numerals. The embodiment shown in FIG. 11 is similar to the embodiment shown in FIG. 10. However, the two spherical nanoparticles 37, 39 on the bottom electrode bridge piece 7 have been replaced by a single spherical nanoparticle 39 positioned between the spherical nanoparticle below 33 and in contact with top electrode 11 and the spherical nanoparticle 35 located on the extension of bottom electrode 1. A first resistive switch 13 and a complementary resistive switch 17 are formed between the nanoparticles 33, 35, 39 by providing a resistive switching material be-tween the nanoparticles 33, 35, 39 and in the entire layer of material between the substrate and the top electrode 11.

Many variations can be provided to the embodiments of the disclosure as shown in the figures. In particular, the spherical nanoparticles can be replaced by nanoparticles of other shapes such as cubic, rectangular or oval nanoparticles.

The invention claimed is:

1. A microelectronic device, comprising:
   a substrate;
   a first electrode arranged above the substrate;
   a first resistive switch and a resistivity structure coupled with each other, the first resistive switch and the resistivity structure being arranged in a same layer of the device;
   a second electrode arranged above the layer that includes the first resistive switch and the resistivity structure; and
   an isolator material arranged between the first electrode and the second electrode at a location including an area in which the first electrode and the second electrode cross each other, the isolator material being adjacent the first resistive switch and the resistivity structure,
   wherein the isolator material, the first resistive switch and the resistivity structure are located in the same layer, and
   wherein the first resistive switch and the resistivity structure are coupled with the first and the second electrode.

2. The microelectronic device of claim 1, wherein the resistivity structure is a second resistive switch that is anti-serially coupled with the first resistive switch.

3. The microelectronic device of claim 2,
wherein the first resistive switch and the second resistive switch are each configured to change their state of conductivity between a state of high conductivity and a state of low conductivity upon application of an electric field or an electric current across a bistable switching material of the first resistive switch and across a bistable switching material of the second resistive switch, respectively, and
wherein the first resistive switch and the second resistive switch are formed with a single piece of bistable switching material.

4. The microelectronic device of claim 1, wherein the resistivity structure is a diode comprising a metal-semiconductor junction.

5. The microelectronic device of claim 1, wherein the first resistive switch comprises a resistive switching material selected from the group consisting of an organic bistable polymer and a semiconductor.

6. The microelectronic device of claim 1,
wherein the first electrode and the second electrode each comprise a geometry of a strip, and
wherein the strips cross each other.

7. The microelectronic device of claim 1, further comprising at least one member selected from the group consisting of a first electrode bridge piece and a second electrode bridge piece,
wherein the first electrode bridge piece is formed on the substrate next to the first electrode, and the second electrode bridge piece is formed over the layer including the first resistive switch and the resistivity structure and next to the second electrode.

8. A method of fabricating a microelectronic device, Comprising:
forming a first electrode on a substrate,
forming a first resistive switch and a resistivity structure in a same layer of the device including depositing a resistive switching material,
forming an isolator material, and
forming a second electrode above the layer including the first resistive switch and the resistivity structure,
wherein the first electrode and the second electrode are in contact with the first resistive switch and the resistivity structure,
wherein the isolator material is adjacent the first resistive switch and the resistivity structure and between the first electrode and the second electrode in an area where the first electrode and the second electrode cross each other, and
wherein the isolator material, the first resistive switch and the resistivity structure are located in the same layer.

9. The method of claim 8, wherein the forming of the resistivity structure comprises forming a second resistive switch that is anti-serially connected with the first resistive switch using a single piece of resistive switching material.

10. The method of claim 9, further comprising:
forming a first electrode bridge piece next to the first electrode on the substrate, and
forming at least one of the first resistive switch and the second resistive switch over the first electrode bridge piece,
wherein one of the first resistive switch and the second resistive switch is formed between the first electrode bridge piece and the second electrode in an area where the first electrode bridge piece and the second electrode cross each other.

11. The method of claim 9, further comprising forming a via in contact with the first electrode, the via being formed in the same layer in which the first resistive switch and the second resistive switch are formed.

12. The method of claim 10, further comprising forming one or several nanoparticles arranged between the resistive switching material of the first resistive switch and a resistive switching material of the second resistive switch and at least one of the first electrode, the second electrode, the first electrode bridge piece, and the second electrode bridge piece.

13. The method of claim 9, further comprising:
forming the first resistive switch and the second resistive switch with a single piece of resistive switching material that is formed on the first electrode bridge piece, and
forming the second electrode over a first part of the resistive switching material to form the first resistive switch, and a second electrode bridge piece in contact with a second part of the resistive switching material to form the second resistive switch.

* * * * *